Nov. 16, 1965 L. C. WHITE 3,217,401
METHOD OF ATTACHING METALLIC HEADS TO SILICON LAYERS OF SEMICONDUCTOR DEVICES
Filed June 8, 1962
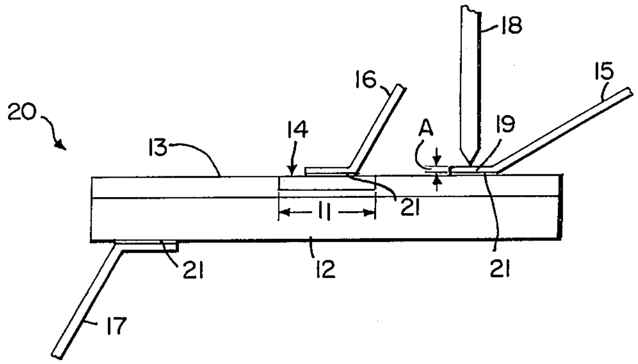
Loring C. White INVENTOR.
BY Ezekiel Wolf, Wolf & Greenfield
ATTORNEYS United States Patent Office 3,217,401
Patented Nov. 16, 1965

3,217,401

METHOD OF ATTACHING METALLIC HEADS TO SILICON LAYERS OF SEMICONDUCTOR DEVICES

Loring C. White, Reading, Mass., assignor to Transitron Electronic Corporation, Wakefield, Mass., a corporation of Delaware Filed June 8, 1962, Ser. No. 201,049
5 Claims. (Cl. 29—472.9)

The present invention relates to a novel and improved method for attaching leads to silicon materials useful in the electronics industry. More specifically, this invention provides a method of forming mechanically strong joints and low ohmic contacts between conductive leads and underlying silicon materials in a rapid and efficient manner.

Various semiconductor devices such as transistors and diodes are formed by combining different combinations of N and P type silicon layers. Problems arise in firmly attaching electrical leads to the silicon materials of such devices. These problems are aggravated by the relatively small size of the leads and silicon materials to be joined, oxide coatings on the surface of the silicon materials and the necessity of employing low temperatures in order to prevent destruction of the devices.

Various soldering, welding and compression techniques are frequently employed to attach leads. However, such techniques as presently practiced often result in poor lead attachments and destruction of and/or contamination of the devices.

In some cases methods have been used which require the predepositing of a metal contact area on silicon material. Such methods produce a firm bond without destroying the silicon material, but nevertheless have certain disadvantages. For example, normally the material must be deposited in a cumbersome process by covering the entire surface of the silicon material and utilizing an enclosed furnace and an inert atmosphere. After deposition, various photographic etching techniques must be employed to form contact areas on the silicon material at preselected points. This process is time consuming and requires utilization of relatively expensive and cumbersome equipment.

It is an important object of this invention to provide a simplified method of attaching low ohmic leads to silicon material of electrical devices in a rapid and efficient manner.

It is another object of this invention to provide a method in accordance with the preceding object which enables a mechanically and electrically strong joint to be formed between the electrical leads and the silicon materials.

It is a further object of this invention to provide a method in accordance with the preceding objects which is useful for attaching small size leads to silicon materials of miniature electrical components.

Generally, the method of this invention is carried out by first coating a metallic lead with a thin layer of aluminum. The aluminum coated lead is then pressed against a silicon material while simultaneously heating the point of compression to a temperature below the eutectic temperature of silicon and aluminum until a satisfactory bond is attained. In a preferred form the method is carried out employing a platinum lead.

Numerous other features, objects and advantages of the present invention will become apparent from the following specification when read in connection with the accompanying drawing, in which the figure is a schematic illustration of a preferred embodiment of a article produced by the method of this invention.

The method of this invention is preferably employed to bond extremely small leads to miniature semiconductor devices such as 20. The semiconductor device 20 may be any conventional semiconductive device to which a lead is attached but for purposes of description a basically conventional N-P-N type transistor is illustrated. In this example a collector 12 is formed of N type doped silicon having a thickness of 0.010 inch. An emitter 14 is formed of N type doped silicon having a thickness of .0001 inch. A base 13 of P type doped silicon comprises an intrinsic base layer designated at 11 having a thickness of approximately .0001 inch between the collector 12 and the emitter 14. The N type doped silicon is formed by conventional methods of doping silicon with pentavalent type impurities, such as the elements antimony and arsenic. P type doped silicon has a small amount of trivalent impurities for example elements such as gallium and indium. Metallic leads 15, 16 and 17 are joined to base 13, emitter 14 and collector 12, respectively.

It is important that low temperatures be employed to bond the leads 15, 16 and 17 to the elements of the transistor in order to prevent thermal degradation of the junctions between the emitter, base and collector.

In order to simplify the specification, only the method of bonding lead 15 to base 13 will be discussed hereinafter. Nonetheless, it should be understood that leads 16 and 17 may be bonded in exactly the same manner as will be set forth for lead 15.

Generally the method of this invention comprises first selecting a thin metallic lead as shown at 15 preferably having a substantially planar contact surface 19 at one end to be joined to a silicon surface. Platinum is the preferred material for the lead since it bonds well to aluminum and is highly resistant to attack in subsequent manufacturing procedures conventionally used. For example, cleaning of the completed transistor with acids does not affect a platinum lead. However, any metal having good conductive properties may be bonded to a thin aluminum layer as hereinafter described and employed in the method of this invention. For example, nickel and copper may be employed in place of platinum. The area of the contact surface 19 is preferably less than 800 square mils. The thickness of the contact end of the base lead designated generally at "A" is extremely small and preferably 3 mils or less. If the thickness "A" is too large, it has been found that snapping of the lead may occur. When areas larger than 800 square mils are used for the contact surface 19, poor bonding often results.

Preferably the metallic lead and the silicon material to be joined are initially cleaned of foreign materials by conventional procedures. For example, a hydrofluoric acid bath may be used to clean the silicon.

A thin aluminum layer 21 having a thickness of approximately 200–5,000 Angstroms and preferably 500 Angstroms is coated on the lead employing conventional metalizing or metal cladding techniques. Metallic vapor spraying or vacuum decomposition methods may be employed to form the aluminum coating. The aluminum layer 21 preferably covers only the contact surface 19. However, in some embodiments of the invention the aluminum layer may cover other portions of the lead as well as the contact surface 19.

The aluminum coated lead is then bonded to the silicon surface of base 13 by employing a heated bonding tip 18 to compress the aluminum coated surface 19 against the base 13. The bonding tip exerts pressures of from 15,000 p.s.i. to 30,000 p.s.i. against the platinum backing of the aluminum layer. The bonding temperature employed is below the eutectic temperature of aluminum and silicon alloy, i.e., 577° C., and may be as low as 400° C. Any temperature between 400° C. and 577° C. may be used. Preferably temperatures of about 450° C. are employed. The pressure and heat are preferably employed for at least three seconds, however, longer periods of time may be employed.

Preferably the entire joint area formed by the aluminum layer 21 and the base 13 is heated to a temperature between 400° C. and 577° C. by heating the entire silicon device to the desired temperature. This may be accomplished by placing the lower surface of collector 12 in contact with a heater (not shown) during the bonding procedure, thus heating all of the silicon material in the device.

The method of this invention produces a mechanically and electrically strong bond between the lead 15 and the silicon base 13. The method may be carried out in the atmosphere employing a simple heated bonding tip.

It is believed that the contact end of the platinum lead 15 provides a backing which helps to distribute the pressure applied by the bonding tip 18 over contact surface 19. The backing thus prevents tearing or uneven joining of the aluminum layer to the silicon layer. It is further believed that the aluminum layer reduces an oxide layer normally present on the silicon surface and forms a microalloy contact a few hundred Angstroms below the surface of the silicon.

In the specific example illustrated in the drawing the contact surface 19 of the platinum lead 15 has a twenty-five square mil area. Thickness "A" is 2 mils and the aluminum layer has a thickness of 500 Angstroms. A temperature of 450° C. and a pressure of 20,000 p.s.i. is employed to compress the lead against the silicon surface for a period of 15 seconds. It has been found that the bond between the lead 15 and the silicon layer 13 is so strong that in many cases, when excess force is applied to the lead and the lead pulled away from the silicon material, some of the silicon material remains attached to the lead. In effect, the joint itself does not break but the silicon material breaks.

In an alternate form of the invention, an aluminum coating may be provided over a contact area of platinum disc contact. The dimensions and conditions as above described with respect to the contact end of the lead 15 are employed in this embodiment. After the contact disc is attached to a silicon surface by the method of this invention, a wire may be soldered to the disc whereby the contact disc acts as a portion of the lead formed.

In another specific example of this invention, thin semi-conductive diodes of the NP type are formed. A platinum disc having a thickness of 2 mils and a contact surface area of 60 square mils was coated with a 500 Angstrom thick layer of aluminum by metallic vapor spraying. Previous to the aluminum coating step, the platinum contact surface was cleaned by applying hydrofluoric acid and subsequently washing with ammonium hydroxide and water. Contacts were attached to the diodes by compressing the contacts with the aluminum side facing the silicon material at a pressure of 20,000 lbs. per sq. inch, temperature 450° C. for 25 seconds. 1.5 mil gold wires were then attached to the platinum side of the contacts with silver plaste. The diodes were then encapsulated in a conventional silicone resin and cured. The diodes were then labelled 1–10 and tested by applying a 10 milliamp current across the diode and measuring the forward voltage. In a second test a 100 microamp current was applied across the diode. The table indicates the forward voltage as measured by a trace scope and a classifier, columns 2 and 3, respectively. After the initial testing, the diodes were subjected to vibration, shock and centrifuge treatments as prescribed in military specification No. 19,500–A. The diodes were again tested and gave substantially the same results as shown in the table. This test clearly indicates the bond formed between the silicon surface and the platinum aluminum contacts is an extremely strong durable bond.

*Table*

| I<br>Unit No. | II<br>Trace scope ($V_f$ at 10 milliamps) | | III<br>Classifier ($V_f$ at 100 microamps) | |
|---|---|---|---|---|
| | Before treatment | After treatment | Before treatment | After treatment |
| 1 | 1.0 | 1.1 | 0.9 | 1.0 |
| 2 | 1.5 | 1.5 | 0.9 | 1.0 |
| 3 | 2.2 | 2.3 | 1.0 | 1.0 |
| 4 | 1.0 | 1.0 | 0.9 | 1.0 |
| 5 | 2.3 | 2.3 | 1.1 | 1.2 |
| 6 | 0.8 | 0.9 | 1.0 | 1.0 |
| 7 | 1.2 | 1.3 | 1.0 | 1.1 |
| 8 | 1.8 | 1.5 | 0.9 | 1.0 |
| 9 | 4.1 | 3.0 | 1.1 | 1.1 |
| 10 | 1.0 | 1.0 | 0.9 | 1.0 |

The specific embodiments of this invention described above are by way of example only. Those skilled in the art may now make numerous variations. For example, silicon materials of many electrical devices such as solar batteries, NPNP and other type transistors can have leads bonded thereto by the method of this invention. The aluminum layer may be employed over the entire lead rather than restricted to the contact area. Therefor, while there have been described what are at present considered to be preferred embodiments of this invention, it will be obvious to those skilled in the art that various changes and modifications may be made therein without departing from the spirit and scope of the invention, and it is therefore aimed in the appended claims to cover all such changes and modifications as are inherent in the true spirit and scope of this invention.

What is claimed is:

1. A method of attaching a conductive metallic lead to a silicon layer of a semiconductive device, said method comprising, coating a portion of said metallic lead with a layer of aluminum having a thickness between approximately 200 and 5,000 Angstroms, the metal of said metallic lead substantially consisting of a metal selected from the group consisting of platinum, nickel and copper, compressing said aluminum coated portion against a surface of said silicon layer over a contact area of less than 800 square mils while simultaneously heating said aluminum coated portion to a temperature between approximately 400° C. and 577° C. to form a mechanically strong and low ohmic bond between said lead and said silicon layer.

2. A method in accordance with claim 1 wherein said metallic lead is platinum.

3. A method in accordance with claim 1 wherein a force of 15,000 to 30,000 p.s.i. is applied to said contact area.

4. In the manufacture of electrical devices having thin layers of P and N doped silicon, the method of attaching a platinum lead to one of said layers, said method comprising, pressing a contact area of a portion of a platinum lead having an outer layer of aluminum thereover against a surface of said one layer, said layer of aluminum having a thickness between 200 and 5000 Angstroms, said contact area being less than 800 square mils, and said lead portion having a thickness no greater than 3 mils, heating said contact area to a temperature between approximately 400° C. and 577° C. to form a bond between said metallic lead and said one layer.

5. A method in accordance with the method of claim 1 wherein said silicon layer is doped to have P or N type conductivity.

References Cited by the Examiner

UNITED STATES PATENTS

| | | | |
|---|---|---|---|
| 3,006,067 | 10/1961 | Anderson et al. | 29—504 X |
| 3,006,068 | 10/1961 | Anderson et al. | 29—504 X |
| 3,012,316 | 12/1961 | Knau | 29—504 X |
| 3,025,439 | 3/1962 | Anderson | 29—472.9 X |

JOHN F. CAMPBELL, *Primary Examiner*.